United States Patent
Tantiwong et al.

(10) Patent No.: US 10,332,772 B2
(45) Date of Patent: Jun. 25, 2019

(54) MULTI-ZONE HEATED ESC WITH INDEPENDENT EDGE ZONES

(71) Applicant: APPLIED MATERIALS, INC., Santa Clara, CA (US)

(72) Inventors: Kyle Tantiwong, Livermore, CA (US); Vladimir Knyazik, Santa Clara, CA (US); Samer Banna, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 489 days.

(21) Appl. No.: 14/762,796

(22) PCT Filed: Mar. 10, 2014

(86) PCT No.: PCT/US2014/022463
§ 371 (c)(1),
(2) Date: Jul. 22, 2015

(87) PCT Pub. No.: WO2014/164449
PCT Pub. Date: Oct. 9, 2014

(65) Prior Publication Data
US 2015/0364354 A1    Dec. 17, 2015

Related U.S. Application Data

(60) Provisional application No. 61/780,627, filed on Mar. 13, 2013.

(51) Int. Cl.
*H01L 21/683* (2006.01)
*H01L 21/67* (2006.01)
*H01J 37/32* (2006.01)

(52) U.S. Cl.
CPC ...... *H01L 21/6833* (2013.01); *H01J 37/3244* (2013.01); *H01L 21/67109* (2013.01);
(Continued)

(58) Field of Classification Search
None
See application file for complete search history.

(56) References Cited

U.S. PATENT DOCUMENTS 6,490,146 B2    12/2002    Wang et al.
6,538,872 B1    3/2003     Wang et al.
(Continued)

FOREIGN PATENT DOCUMENTS

KR    10-2005-0005344 A    1/2005

OTHER PUBLICATIONS

The PCT Search Report and Written Opinion dated Jul. 11, 2014 in (PCT/US2014/022463), 13 pages total.

*Primary Examiner* — Sylvia MacArthur
(74) *Attorney, Agent, or Firm* — Schwabe, Williamson & Wyatt, P.C.

(57) ABSTRACT

An electrostatic chuck (ESC) with a cooling base for plasma processing chambers, such as a plasma etch chamber. In embodiments, a plasma processing chuck includes a plurality of independent edge zones. In embodiments, the edge zones are segments spanning different azimuth angles of the chuck to permit independent edge temperature tuning, which may be used to compensate for other chamber related non-uniformities or incoming wafer non-uniformities. In embodiments, the chuck includes a center zone having a first heat transfer fluid supply and control loop, and a plurality of edge zones, together covering the remainder of the chuck area, and each having separate heat transfer fluid supply and control loops. In embodiments, the base includes a diffuser, which may have hundreds of small holes over the chuck area to provide a uniform distribution of heat transfer fluid.

15 Claims, 5 Drawing Sheets

(52) U.S. Cl.
CPC .... *H01L 21/67248* (2013.01); *H01L 21/6831* (2013.01); *Y10T 279/23* (2015.01)

(56) References Cited

U.S. PATENT DOCUMENTS

| | | | |
|---|---|---|---|
| 6,740,853 B1 | 5/2004 | Johnson et al. | |
| 8,226,769 B2 | 7/2012 | Matyushkin et al. | |
| 8,461,674 B2 | 6/2013 | Gaff et al. | |
| 8,546,732 B2 | 10/2013 | Singh | |
| 8,587,113 B2 | 11/2013 | Gaff et al. | |
| 8,624,168 B2 | 1/2014 | Gaff et al. | |
| 8,637,794 B2 | 1/2014 | Singh et al. | |
| 8,663,391 B2 | 3/2014 | Matyushkin et al. | |
| 8,884,194 B2 | 11/2014 | Singh et al. | |
| 8,937,800 B2 | 1/2015 | Lubomirsky et al. | |
| 9,196,514 B2 | 11/2015 | Parkhe et al. | |
| 2005/0258160 A1 | 11/2005 | Goto et al. | |
| 2006/0019039 A1 | 1/2006 | Hanawa et al. | |
| 2007/0256785 A1 | 11/2007 | Pamarthy et al. | |
| 2008/0017104 A1 | 1/2008 | Matyushkin et al. | |
| 2009/0114158 A1 | 5/2009 | Zucker et al. | |
| 2013/0161305 A1 | 6/2013 | Ptasienski et al. | |
| 2013/0220989 A1 | 8/2013 | Pease et al. | |
| 2013/0276980 A1 | 10/2013 | Lubomirsky et al. | |
| 2014/0045337 A1 | 2/2014 | Singh et al. | |
| 2014/0047705 A1 | 2/2014 | Singh et al. | |
| 2014/0048529 A1 | 2/2014 | Pease | |
| 2014/0096909 A1 | 4/2014 | Singh et al. | |
| 2014/0154819 A1 | 6/2014 | Gaff et al. | |
| 2015/0129165 A1 | 5/2015 | Parkhe et al. | |
| 2015/0155193 A1 | 6/2015 | Hsu et al. | |
| 2015/0170977 A1 | 6/2015 | Singh | |
| 2015/0187625 A1 | 7/2015 | Busche et al. | |
| 2015/0187626 A1 | 7/2015 | Parkhe et al. | |
| 2015/0228513 A1 | 8/2015 | Parkhe et al. | |
| 2015/0311105 A1 | 10/2015 | Sadjadi et al. | |
| 2015/0364354 A1* | 12/2015 | Tantiwong | H01L 21/67109 156/345.34 |
| 2015/0366004 A1 | 12/2015 | Nangoy et al. | |
| 2016/0027678 A1 | 1/2016 | Parkhe et al. | |

\* cited by examiner

MULTI-ZONE HEATED ESC WITH INDEPENDENT EDGE ZONES

CROSS-REFERENCE TO RELATED APPLICATIONS

This patent application is a U.S. National Phase Application under 35 U.S.C. § 371 of International Application No. PCT/US2014/022463, filed on Mar. 10, 2014, entitled MULTI-ZONE HEATED ESC WITH INDEPENDENT EDGE ZONES, which claims the priority to the U.S. Provisional Patent Application No. 61/780,627 filed Mar. 13, 2013. This application is related to U.S. Provisional Patent Application 61/649,827 titled "ESC WITH COOLING BASE, filed May 21, 2012.

TECHNICAL FIELD

Embodiments of the present invention relate to the microelectronics manufacturing industry and more particularly to temperature controlled chucks for supporting a workpiece during plasma processing.

BACKGROUND

Power density in plasma processing equipment, such as those designed to perform plasma etching of microelectronic devices and the like, is increasing with the advancement in fabrication techniques. For example, powers of 5 to 10 kilowatts are now in use for 300 mm substrates. With the increased power densities, enhanced cooling of a chuck, such as an electrostatic chuck (ESC) is beneficial during processing to control the temperature of a workpiece (wafer) uniformly.

ESC cooling bases designed for extreme thermal uniformity, specifically in the azimuthal direction that include multi-zone ESC heater control allow for the widest process window possible under various process and plasma conditions. Individual heater zones in the radial direction can compensate for minor radial non-uniformities that may be present. Such a design however does not allow for any independent azimuthal temperature control, specifically around the wafer edge. Although some processes require extreme azimuthal temperature uniformity, other processes may require more flexibility of the edge temperature as a function of azimuth angle.

SUMMARY

One or more embodiments are directed to a chuck to support a workpiece during plasma processing. According to one embodiment, the chuck includes a dielectric layer over which the workpiece is to be disposed. The chuck also includes an assembly upon which the dielectric layer is disposed. The assembly defines a plurality of independent zones through which a heat transfer fluid is to be separately circulated. The plurality of zones includes a center zone disposed proximate a center of the chuck and a plurality of edge zones disposed proximate to an outer perimeter of the chuck, surrounding the center chamber, and each spanning a different range of azimuth angles.

In one embodiment, a plasma etch system includes a vacuum chamber and a showerhead though which a source gas is supplied to the vacuum chamber. The system includes chuck with a dielectric layer over which the workpiece is to be disposed. The chuck also includes an assembly upon which the dielectric layer is disposed. The assembly defines a plurality of independent zones through which a heat transfer fluid is to be separately circulated. The plurality of zones includes a center zone disposed proximate a center of the chuck and a plurality of edge zones disposed proximate to an outer perimeter of the chuck, surrounding the center chamber, and each spanning a different range of azimuth angles. The system includes a heat transfer fluid loop fluidly coupling the zones of the chuck to a high pressure side of a heat exchanger or chiller and to a low pressure side of the heat exchanger or chiller through a manifold, the manifold including separate flow controls for two or more of the zones.

According to one embodiment, a method of plasma etching involves supporting a workpiece in a vacuum chamber over a dielectric layer of a chuck assembly. The method involves supplying a source gas to the vacuum chamber. The method involves processing the workpiece with plasma generating from the source gas. The method also involves separately circulating a heat transfer fluid though a plurality of independent zones defined in the chuck assembly. The plurality of zones includes a center zone disposed proximate a center of the chuck assembly and a plurality of edge zones disposed proximate to an outer perimeter of the chuck assembly, surrounding the center chamber, and each spanning a different range of azimuth angles.

BRIEF DESCRIPTION OF THE DRAWINGS

Embodiments of the present invention are illustrated by way of example, and not limitation, in the figures of the accompanying drawings in which.

DETAILED DESCRIPTION

In the following description, numerous details are set forth, however, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" my be used to indicated that two or more elements are in either direct or indirect (with other intervening elements between them) physical, optical, or electrical contact with each other, and/or that the two or more elements co-operate or interact with each other (e.g., as in a cause an effect relationship).

The terms "over," "under," "between," and "on" as used herein refer to a relative position of one component or material layer with respect to other components or layers where such physical relationships are noteworthy. For example in the context of material layers, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similar distinctions are to be made in the context of component assemblies.

In embodiments described herein, a plasma processing chuck includes a plurality of independent edge zones. In embodiments, the edge zones cover different azimuth angles of the chuck perimeter to permit independent edge temperature tuning, which may be used to compensate for other chamber related non-uniformities or incoming wafer non-uniformities. In embodiments, the chuck includes a center zone (e.g., covering 50-90% of the chuck area) having a first heat transfer fluid supply inlet and outlet and a first temperature control loop, while each of the plurality of edge zones, together covering the remainder of the chuck area, have separate heat transfer fluid supply inlets and outlets and separate temperature control loops.

Figure 1:
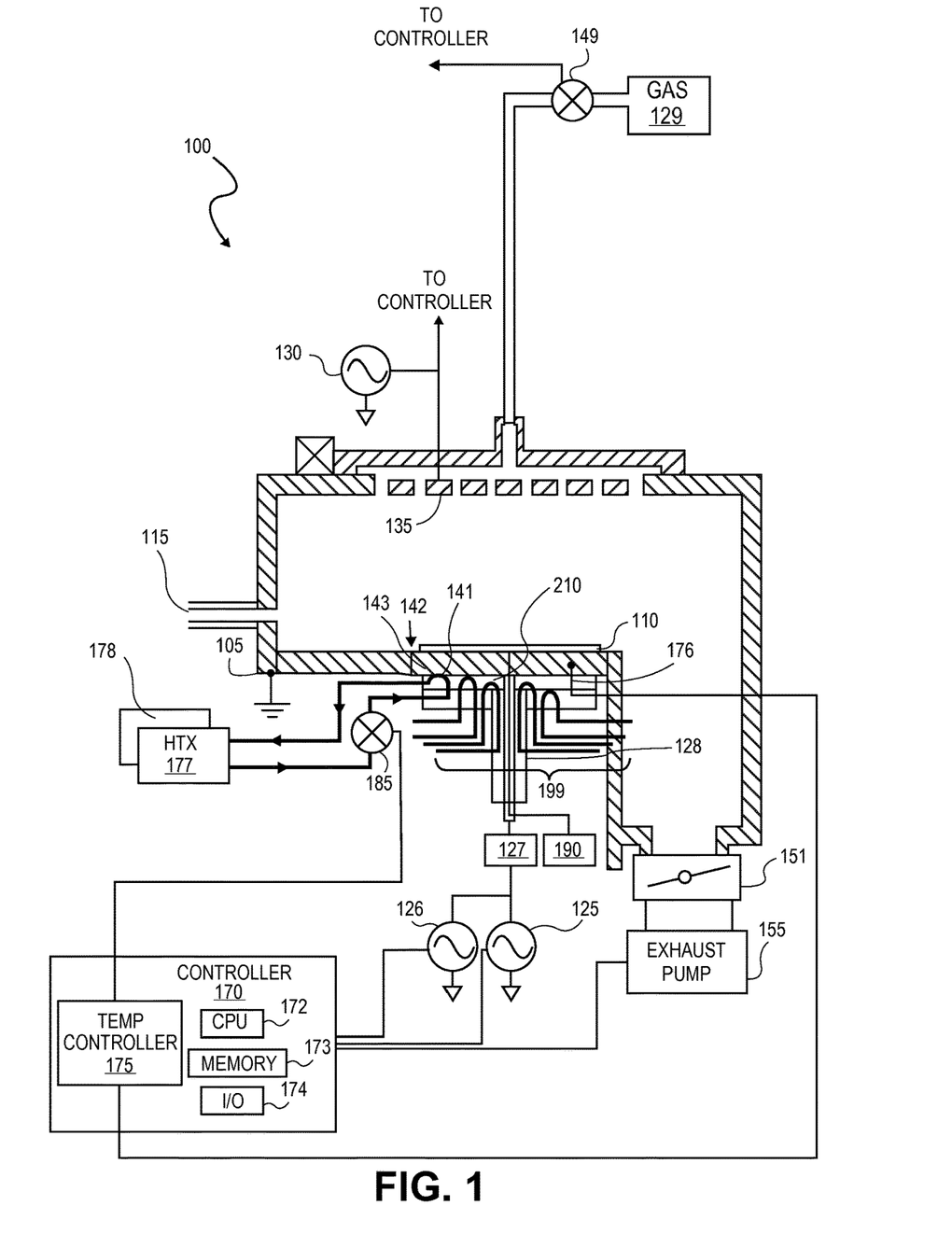
FIG. 1 is a schematic of a plasma etch system including a chuck assembly in accordance with an embodiment of the present invention.

FIG. 1 is a schematic of a plasma etch system 100 including a chuck assembly 142 in accordance with an embodiment of the present invention. The plasma etch system 100 may be any type of high performance etch chamber known in the art, such as, but not limited to, Enabler™, DPS II, AdvantEdge™ G3, E-MAX®, Axiom, Orion, or Mesa CIP chambers, all of which are manufactured by Applied Materials of CA, USA. Other commercially available etch chambers may similarly utilize the chuck assemblies described herein. While the exemplary embodiments are described in the context of the plasma etch system 100, the chuck assembly described herein is also adaptable to other processing systems used to perform any plasma fabrication process (e.g., plasma deposition systems, etc.) that place a heat load on the chuck.

Referring to FIG. 1, the plasma etch system 100 includes a grounded chamber 105. Process gases are supplied from gas source(s) 129 through a mass flow controller 149 to the interior of the chamber 105. Chamber 105 is evacuated via an exhaust valve 151 connected to a high capacity vacuum pump stack 155. When plasma power is applied to the chamber 105, a plasma is formed in a processing region over workpiece 110. A plasma bias power 125 is coupled into the chuck assembly 142 to energize the plasma. The plasma bias power 125 typically has a low frequency between about 2 MHz to 60 MHz, and may be for example in the 13.56 MHz band. In the exemplary embodiment, the plasma etch system 100 includes a second plasma bias power 126 operating at about the 2 MHz band which is connected to the same RF match 127 as plasma bias power 125 and coupled to a lower electrode via a power conduit 128. A conductor 190 provides DC voltage to an ESC clamp electrode disposed in the dielectric material 143. A plasma source power 130 is coupled through a match (not depicted) to a plasma generating element 135 to provide high frequency source power to inductively or capacitively energize the plasma. The plasma source power 130 may have a higher frequency than the plasma bias power 125, such as between 100 and 180 MHz, and may for example be in the 162 MHz band.

A workpiece 110 is loaded through an opening 115 and clamped to a chuck assembly 142. The workpiece 110, such as a semiconductor wafer, may be any conventionally employed in the plasma processing art and the present invention is not limited in this respect. The workpiece 110 is disposed on a top surface of a dielectric layer 143 disposed over a cooling base assembly 210. Embedded in the dielectric layer 143 is a clamp electrode (not depicted). In particular embodiments, the chuck assembly 142 includes a center zone 141 and a plurality of edge zones 199, each zone 141, 199 is independently controllable to a setpoint temperature. In the exemplary embodiment, the plurality of edge zones 199 provides independent control over separate azimuthal angles relative to a center of the chuck. In the exemplary embodiment, nine independent temperature zones are provided with eight edge zones forming a perimeter about a center zone of the top surface area of the chuck assembly 142.

The temperature controller 175 is to execute temperature control algorithms (e.g., temperature feedback control) and may be either software or hardware or a combination of both software and hardware. The temperature controller 175 may further comprise a component or module of the system controller 170 responsible for management of the system 100 through a central processing unit 172, memory 173 and input/output interface 174. The temperature controller 175 is to output control signals affecting the rate of heat transfer between the chuck assembly 142 and a heat source and/or heat sink external to the plasma chamber 105 for the center zone 141, and separate edge zones 199.

In embodiments, each of the different temperature zones is coupled to a separate, independently controlled heat transfer fluid loop with separate flow control that is controlled based on a zone-specific temperature feedback loop. In the exemplary embodiment having a plurality of edge temperature zones 199 surrounding a center zone 141, the temperature controller 175 is coupled to a first heat exchanger (HTX)/chiller 177 and may further be coupled to a second HTX/chiller 178. The azimuthal edge temperature zones 199 may be plumbed to the same HTX 177, as further depicted in FIG. 3, such that the temperature controller 175 may acquire the temperature setpoint of the heat exchanger 177, as well as a center and plurality of edge temperatures 176 (one for each of the edge zones 199), and control heat transfer fluid flow rate through fluid conduits in the chuck assembly 142. Generally, the heat exchanger 177 is to cool both the center portion of the chuck assembly 142 and the annular edge temperature zones 199 (e.g., each spanning a 45° arc) of the chuck perimeter.

One or more valves 185 (or other flow control devices) between the heat exchanger/chiller 177 and fluid conduits in the chuck assembly 142 may be controlled by temperature controller 175 to independently control a rate of flow of the heat transfer fluid to each of the center zone 141 and the plurality of annular edge zones 199. In the exemplary embodiment therefore, nine heat transfer fluid loops are employed, and for each loop, any heat transfer fluid known in the art may be used. For example, the heat transfer fluid may be a liquid, such as, but not limited to an ethylene glycol/water mix.

Figure 2:
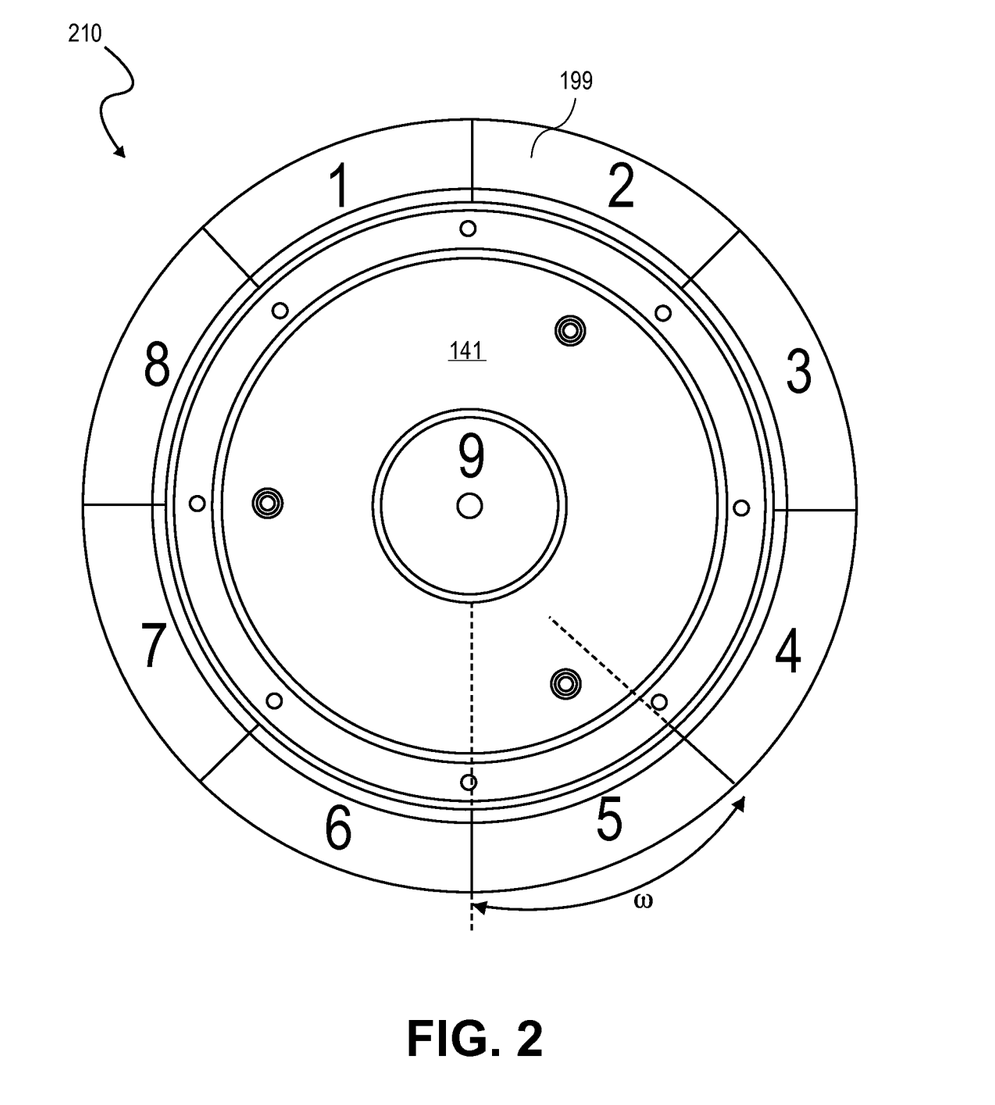
FIG. 2 illustrates a plan view of a cooling base that is employed in the chuck assembly of FIG. 1, in accordance with an embodiment.

FIG. 2 illustrates a plan view of the cooling base assembly 210, in accordance with an embodiment. As shown, the plurality of edge zones 199 surround the center zone 141, forming segments of an annulus. Each of the edge zones 199 spans a particular range of azimuth angle, ω, to permit independent tuning of the cooling base assembly 210 temperature as a function of azimuth angle. In the exemplary embodiment with eight edge zones 199 (1-8 in FIG. 2), ω is ~45°. The edge zones 199 are further defined by an inner edge proximate to the center zone 141 and an outer edge proximate to the perimeter edge of the cooling base assembly 210. The radial distance between the inner and outer edges of the edge zones 199 may vary, but in exemplary embodiment is 15-50 mm. The center zone 141 may have any radius to cover the base area not occupied by the edge zones 199, (e.g., 140-190 mm). In specific embodiments, the area of the cooling base assembly 210 occupied by the center zone 141 is between 50 and 90% of the total surface area of the base while edge zones 199 occupy the balance.

Figure 3:
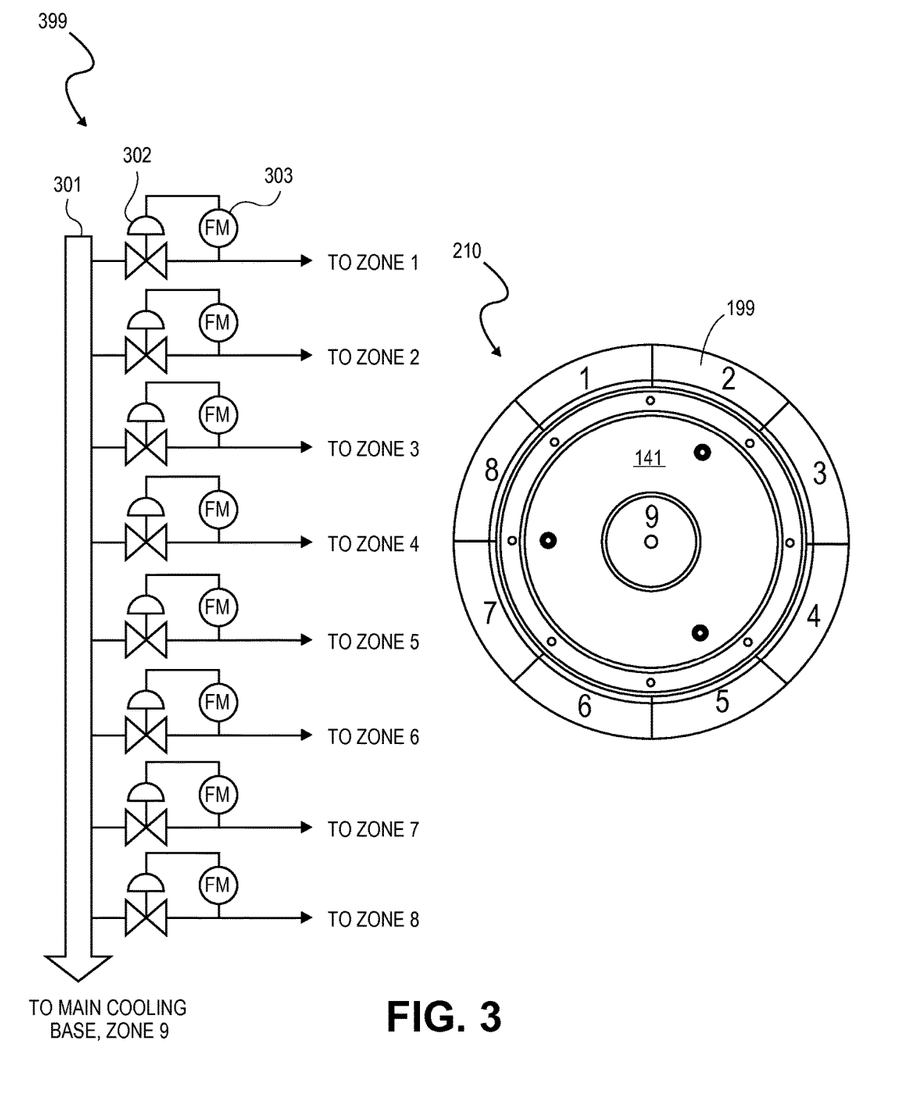
FIG. 3 illustrates a schematic of a heat transfer fluid manifold configured to supply the cooling base of FIG. 2, in accordance with an embodiment.

FIG. 3 illustrates a schematic of a heat transfer fluid manifold 399 configured to supply the cooling base assembly 210, in accordance with an embodiment. In the exemplary embodiment, a flow-through manifold is employed where the primary lines 301 forming a loop between the center zone 141 and the HTX 177 is tapped for each edge zone 199. Heat transfer fluid flow to each of the edge zones 199 is then not isolated from the flow on the primary loop through the center zone 141, and vice versa. For each edge zone, a control valve 302 is controlled via a feedback loop based on measurement output from a downstream flow meter 303. Flow to each edge zone is thereby controlled to a setpoint determined by the temperature controller 175 for a desired azimuthal variation/uniformity across the edge zones. While the flow to each edge zone may only be a fraction of that in the center zone 141, in alternative embodiments where flow to the edge zones 199 is a significant portion of the total flow on the primary loop, an isolated manifold to the edge zones may be provided, separate from the center zone 141. For such embodiments, the isolated manifold is coupled to a second heat transfer fluid reservoir.

Figure 4:
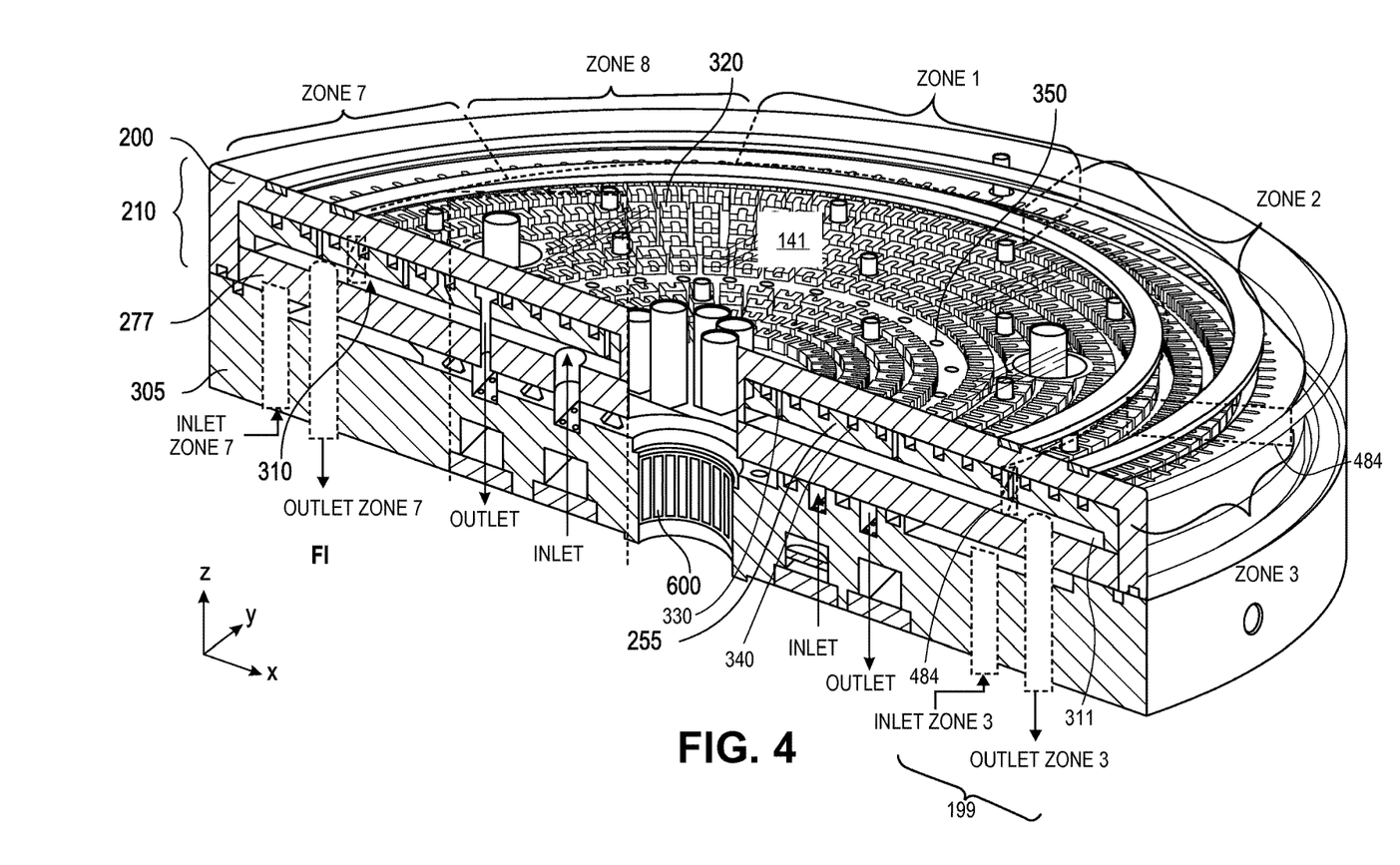
FIG. 4 illustrates sectional isometric view of the cooling base in FIG. 2, in accordance with an embodiment.

Generally, any cooling base may be utilized to implement the azimuthally independent edge zone architecture depicted in FIGS. 2 and 3. For example, in one embodiment, each cooling zone includes separate conduits passing through each region of the base in parallel (e.g., as fed by the manifold 399). FIG. 4 is a sectional isometric view of the cooling base in FIG. 2, in accordance with one exemplary embodiment. In this exemplary embodiment, the flow pattern of the cooling base assembly 210 is closer in nature to a 2-stage showerhead most often employed for gas delivery in a plasma processing chamber. However, in contrast to conventional gas delivery showerheads, where an inlet/outlet is at opposite ends of the assembly, embodiments of the cooling base assembly 210 have fluid inlets and outlets in a same physical plane (i.e., there is a supply and return at a first interface rather than a single-pass of fluid flow through the assembly). As shown in FIG. 4, the cooling base assembly 210 includes a base 200 over which a workpiece is to be disposed, a diffuser 255 over which the base 200 is disposed, and a reservoir plate 277 over which the diffuser 255 is disposed. In the exemplary embodiment, the diffuser 255 and base 200 is each a separate plate of a material, preferably the same material (e.g., aluminum) for the sake of matching coefficients of thermal expansion (CTE). The cooling base assembly 210 may be fabricated in multiple steps, with three main parts/components that are joined (e.g., permanently bonded, press fit, or removably attached by screws, etc.) during fabrication to make one complete base. Disposed over the top surface of the base 200 is the dielectric material 143 (of FIG. 1) upon which the workpiece is to be disposed. The dielectric material 143 may be any known in the art and is in one advantageous embodiment a ceramic (e.g., AlN) to electrostatically clamp the workpiece during processing. Generally, the dielectric material 143 may be operable as any electrostatic chuck (ESC) known in the art, such as, but not limited to a Johnsen-Rahbek (JR) chuck. In one exemplary embodiment, the dielectric material 143 comprises a ceramic puck having at least one electrode (e.g., a mesh or grid) embedded in the ceramic to induce an electrostatic potential between a surface of the ceramic and a workpiece disposed on the surface of the ceramic when the electrode is electrified.

The base 200 is to function as a thermally conductive mechanical fluid barrier between the dielectric material 143 and the diffuser 255. The base 200 has a bottom surface which may be exposed to a heat transfer fluid passed through the diffuser 255. As heat transfer fluid is contained by the base 200 with no fluid passing to the top surface of the base 200, the base may be considered a cap affixed to a showerhead with the diffuser 255 being a showerhead showering the base 200 with a uniform distribution of heat transfer fluid. Because the heat transfer fluid is of a controlled temperature (e.g., supplied from either of the HTX/chiller 177), a uniform distribution of heat transfer fluid maintains the base 200 at a temperature that is highly uniform across the area of each zone (center and edge zones) in the base 200, and therefore across the area of the dielectric material 143, and in turn the workpiece as it undergoes processing.

The cooling base assembly 210 is disposed on a support plate 305. The support plate 305 is affixed to the cooling base assembly 210 and includes an RF coupler 600 (e.g., a multi-contact fitting) disposed at a center of the chuck to receive an RF input cable for powering the chuck (e.g., the chuck assembly 142 of FIG. 1). Heat transfer fluid inlet and outlet fittings to each of the edge zones 199 and center zone 141 are further provided by the support plate 305 as an interface for facilitating the cooling base assembly 210. In the exemplary embodiment, the support plate 305 is of a same material as the cooling base assembly (e.g., aluminum).

In an embodiment, the diffuser 255 includes a plurality of supply openings 330 that pass through the diffuser 255 and place the bottom surface of the base 200 in fluid communication with a center zone supply reservoir 310 disposed between the diffuser 255 and the reservoir plate 277. The supply openings 330 are to uniformly distribute heat transfer fluid to the base 200 across the surface area of the base 200. In an advantageous embodiment, there are at least fifty supply openings 330 arranged with azimuthal symmetry about a circular area of the diffuser 255, and in the exemplary embodiment, there are hundreds of the supply openings 330. The azimuthal symmetry, large number of supply openings and wide contiguous area of the underlying supply reservoir 310 work together to provide concentric temperature distributions or boundary conditions within the center zone 141. Annual arrangements of heater elements (e.g., resistive) can then be utilized to optimize the radial temperature distribution.

The supply openings 330 allow for fluid incoming from upstream below the diffuser 255 to build pressure and uniformly flow upward through the diffuser 255. Barriers 484 (shown in dashed line in FIG. 4) are disposed between the center zone 141 and each of the edge zones 199 (e.g., zones 1-9 are demarked by dotted lines), as well as between adjacent edge zones 199. The barriers 484 partition the supply openings 330 according to the separate edge and center zones. Within each zone therefore, there are a plurality of the supply openings 330 fed by an inlet and drained by an outlet dedicated to each zone. As such, the azimuthal symmetry of the openings ensures azimuthally symmetric heat transfer fluid flow to the base 200 within each zone while the independent zone-level flow control provides for the azimuth control/tunability across the base. The great number of supply openings 330 ensures a reasonably low pressure pump is sufficient to drive the heat transfer fluid through the coolant loop (e.g., from the HTX/chiller 177, through the supply openings 330, and back).

As shown, the center supply reservoir 310 is an in annular cavity having a width in the radial direction that spans a plurality of annular channels 340. Separate edge supply reservoirs 311 are associated with each of the edge zones as well. Functionally, the supply reservoirs 310, 311 are to provide a low pressure drop across contiguous area of the reservoir spanning a given zone (center zone 141, or one of the edge zones 199) so that openings in the diffuser 255 present a uniform pressure differential across the surface area of the diffuser 255 within the zone. As illustrated in FIG. 4, the supply reservoirs 310, 311 are provided by a standoff at the outer perimeter of the back surface of the diffuser 255, however the reservoir plate 277 may have a functional equivalent feature to space apart facing surfaces of the diffuser 255 and reservoir plate 277.

In an embodiment, the diffuser 255 includes at least one return opening 350 for each zone through which heat transfer fluid is returned through the reservoir plate 277. As shown in the cross-section, the return openings pass through the diffuser 255. Aligned with the return opening 350, the diffuser 255 forms a male fitting that seats into a return opening in the reservoir plate 277. The male fitting forms a return conduit that passes though the supply reservoirs 310, 311.

In an embodiment, at least a first of the base 200 and the diffuser 255 have a plurality of bosses 320 in physical contact with a second of the base 200 and the diffuser 255. Either a bottom surface of the base 200 or a top surface of the diffuser 255, facing the bottom surface of the base 200, may be machined to have the bosses 320. In the exemplary embodiment, the bosses 320 are machined into the diffuser 255. As shown in FIG. 4, a top surface of a boss 320 is in direct physical contact with a bottom surface of the base 200. The annular channels 340 place the plurality of supply openings 330 in fluid communication with at least one return opening 350 for each one of the center zone 141, or edge zones 199. Because the bosses 320 are discontinuous along the azimuth angle, the plurality of bosses 320 further define a plurality of radial channels fluidly coupling adjacent annular channels 340. The supply opening 330 is disposed within a boss 320 with each boss 320 further including a boss channel fluidly coupling the supply opening 330 with an annular channel 340. In embodiments, the return openings 350 are disposed in one or more of the annular channels 340, and/or radial channels. In the exemplary embodiment, the return openings 350 are disposed in an annular channel 340. As illustrated by FIG. 4, a plurality of return openings 350 are disposed at a same radial distance as one of the annular channels 340 and at different azimuthal angles (e.g., about every 18° in the depicted embodiment).

In embodiments, resistive heaters are embedded in at least one of the dielectric material 143, the base 200, the diffuser 255, the reservoir plate 277, or the support plate 305. In one advantageous embodiment, resistive heaters are embedded in the dielectric material 143. In the exemplary embodiment, a plurality of individual heater zones in the radial direction (e.g., an inner diameter and an outer annulus surrounding the inner diameter) is to compensate for minor radial non-uniformities in temperature that may be present.

Figure 5:
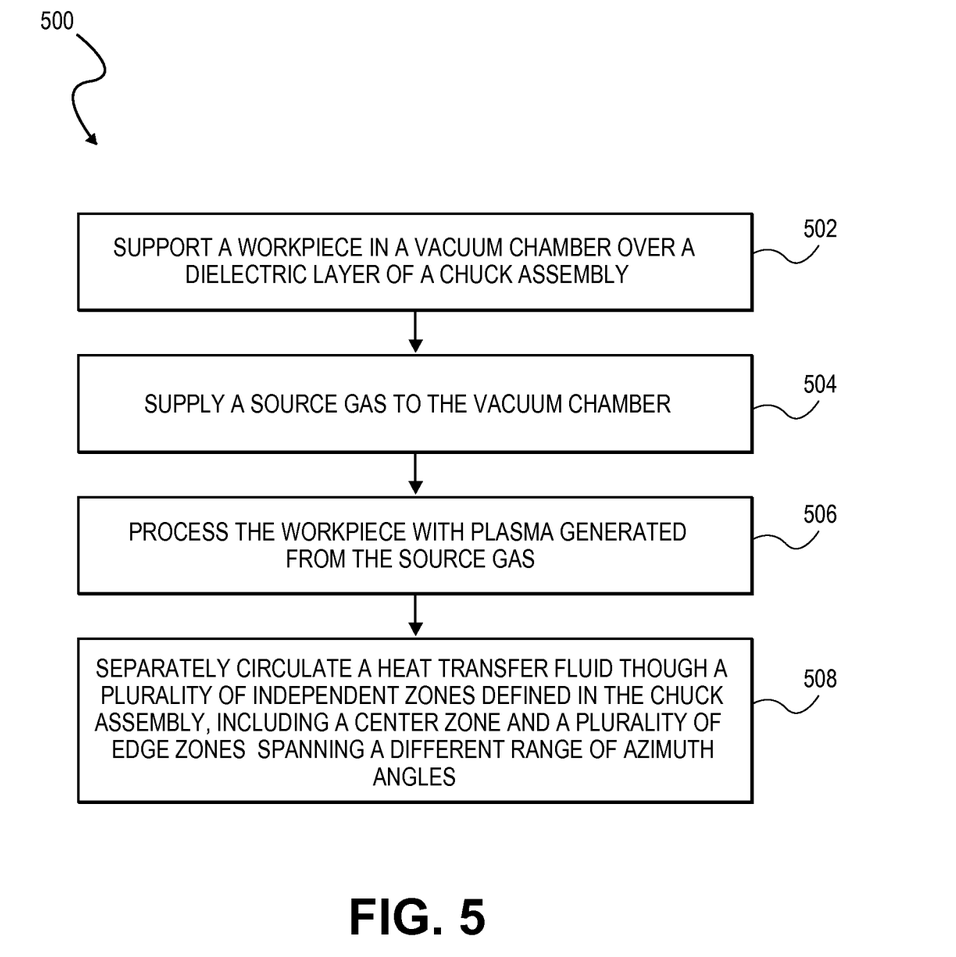
FIG. 5 is a flow diagram of a method of plasma processing, in accordance with an embodiment.

FIG. 5 is a flow diagram of a method 500 of plasma processing, in accordance with an embodiment.

The method 500 begins with supporting a workpiece in a vacuum chamber over a dielectric layer of a chuck assembly, at operation 502. For example, the workpiece may be supported over a dielectric layer of a chuck assembly such as the chuck assembly 142 of FIG. 1. The method involves supplying a source gas to the vacuum chamber and processing the workpiece with plasma generated from the source gas, at operations 504 and 506.

While processing the workpiece, the method 500 involves separately circulating a heat transfer fluid though a plurality of independent zones defined in the chuck assembly, at operation 508. FIG. 2 illustrates one example of a plurality of nine independent zones. The plurality of zones includes a center zone (e.g., the center zone 141 of FIG. 2) disposed proximate a center of the chuck assembly and a plurality of edge zones (e.g., the edge zones 199 of FIG. 2) disposed proximate to an outer perimeter of the chuck assembly, surrounding the center chamber, and each spanning a different range of azimuth angles. In one embodiment, separately circulating the heat transfer fluid involves circulating the heat transfer fluid through a loop fluidly coupling the zones of the chuck to a high pressure side of a heat exchanger or chiller and to a low pressure side of the heat exchanger or chiller through a manifold. In one such embodiment, the manifold includes separate flow controls for two or more of the zones. Thus, according to embodiments, independent zone-level flow control may provide for independent temperature tunability across the base.

It is to be understood that the above description is intended to be illustrative, and not restrictive. For example, while flow diagrams in the figures show a particular order of operations performed by certain embodiments of the invention, it should be understood that such order is not required (e.g., alternative embodiments may perform the operations in a different order, combine certain operations, overlap certain operations, etc.). Furthermore, many other embodiments will be apparent to those of skill in the art upon reading and understanding the above description. Although the present invention has been described with reference to specific exemplary embodiments, it will be recognized that the invention is not limited to the embodiments described, but can be practiced with modification and alteration within the spirit and scope of the appended claims. The scope of the invention should, therefore, be determined with reference to the appended claims, along with the full scope of equivalents to which such claims are entitled.

What is claimed is:

1. A chuck to support a workpiece during plasma processing, the chuck comprising:

a dielectric layer over which the workpiece is to be disposed; and an assembly upon which the dielectric layer is disposed, the assembly defining a plurality of independent zones through which a heat transfer fluid is to be separately circulated, wherein the plurality of zones includes a center zone disposed proximate a center of the chuck and a plurality of independent edge zones disposed proximate to an outer perimeter of the chuck, surrounding a center chamber, and each spanning a different range of azimuth angles, wherein each of the independent edge zones of the plurality of zones is coupled to a corresponding zone-specific fluid loop, and each of the corresponding zone-specific fluid loops of the independent edge zones is coupled to a corresponding separate zone-specific supply reservoir, and wherein the center zone is coupled to a corresponding zone-specific fluid loop, and the corresponding zone-specific fluid loop of the center zone is coupled to a corresponding separate zone-specific supply reservoir.

2. The chuck of claim 1, wherein the assembly further comprises
a base disposed under the dielectric layer;
a diffuser disposed under the base; and
a reservoir plate disposed under the diffuser, wherein the diffuser comprises a plurality of supply openings within each of the plurality of zones, the plurality of supply openings passing through the diffuser and placing a bottom surface of the base in fluid communication with the zone-specific supply reservoir disposed between the diffuser and the reservoir plate.

3. The chuck of claim 2, wherein the diffuser further comprises at least one return opening within each zone, the at least one return opening passing through the diffuser and coupled with a return conduit that passes through the supply reservoir and has a return opening in the reservoir plate.

4. The chuck of claim 3, wherein at least a first of the base and the diffuser comprises a plurality of bosses in physical contact with a second of the base and the diffuser, wherein the plurality of bosses define at least one annular channel that places the plurality of supply openings within one zone in fluid communication with the at least one return opening.

5. The chuck of claim 3, wherein each supply reservoir is separated from another by a wall impermeable to the heat transfer fluid.

6. The chuck of claim 3, wherein a supply reservoir for the center zone comprises an annular cavity and wherein the supply reservoir for each of the plurality of independent edge zones comprises a cavity spanning an arc length corresponding to the azimuth angles spanned by each of the plurality of independent edge zones.

7. The chuck of claim 3, wherein the at least one return opening comprises a plurality of return openings for the center zone and one return opening for each of the plurality of independent edge zones.

8. The chuck of claim 2, further comprising a ceramic puck disposed over the base, the ceramic puck having at least one electrode embedded therein to induce an electrostatic potential between a surface of the ceramic puck and the workpiece when the at least one electrode is electrified.

9. The chuck of claim 8, wherein at least one of the ceramic puck, the base, the diffuser, and the reservoir plate comprises a plurality of resistive heaters.

10. A plasma etch system comprising:
a vacuum chamber;
a showerhead though which a source gas is supplied to the vacuum chamber;
a chuck comprising a dielectric layer over which a workpiece is to be disposed, and an assembly upon which the dielectric layer is disposed, the assembly defining a plurality of independent zones through which a heat transfer fluid is to be separately circulated, wherein the plurality of zones includes a center zone disposed proximate a center of the chuck and a plurality of independent edge zones disposed proximate to an outer perimeter of the chuck, surrounding a center chamber, and each spanning a different range of azimuth angles, wherein each of the independent edge zones of the plurality of zones is coupled to a corresponding zone-specific fluid loop, and each of the corresponding zone-specific fluid loops of the independent edge zones is coupled to a corresponding separate zone-specific supply reservoir, and wherein the center zone is coupled to a corresponding zone-specific fluid loop, and the corresponding zone-specific fluid loop of the center zone is coupled to a corresponding separate zone-specific supply reservoir; and
a heat transfer fluid loop fluidly coupling the plurality of zones of the chuck to a high pressure side of a heat exchanger or chiller and to a low pressure side of the heat exchanger or chiller through a manifold, the manifold including separate flow controls for two or more of the plurality of zones.

11. The etch system of claim 10, wherein the manifold includes one primary outlet coupled to the center zone and a plurality of secondary outlets, each coupled to an edge zone at the perimeter of the chuck.

12. The etch system of claim 11, wherein the manifold includes a separate flow control valve and flow meter for each of the plurality of secondary outlets.

13. The etch system of claim 10, wherein the assembly further comprises
a base disposed under the dielectric layer;
a diffuser disposed under the base; and
a reservoir plate disposed under the diffuser, wherein the diffuser comprises a plurality of supply openings within each of the plurality of zones, the plurality of supply openings passing through the diffuser and placing a bottom surface of the base in fluid communication with the zone-specific supply reservoir disposed between the diffuser and the reservoir plate.

14. The etch system of claim 13, wherein the plurality of supply openings comprises at least fifty openings arranged with azimuthal symmetry about a circular area of the diffuser.

15. The etch system of claim 13, wherein the diffuser further comprises at least one return opening within each zone, the at least one return opening passing through the diffuser and coupled with a return conduit that passes through the supply reservoir and has a return opening in the reservoir plate.

* * * * *